(12) United States Patent
Huang et al.

(10) Patent No.: US 10,651,052 B2
(45) Date of Patent: May 12, 2020

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Wen Hung Huang, Kaohsiung (TW); Yan Wen Chung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 8 days.

(21) Appl. No.: 15/870,315

(22) Filed: Jan. 12, 2018

(65) Prior Publication Data

US 2019/0221446 A1 Jul. 18, 2019

(51) Int. Cl.
*H01L 23/48* (2006.01)
*H01L 21/48* (2006.01)
(Continued)

(52) U.S. Cl.
CPC ........ *H01L 21/4857* (2013.01); *H01L 21/481* (2013.01); *H01L 21/4853* (2013.01); *H01L 21/561* (2013.01); *H01L 21/6835* (2013.01); *H01L 23/49816* (2013.01); *H01L 23/49822* (2013.01); *H01L 23/49838* (2013.01); *H01L 23/66* (2013.01); *H01L 23/3128* (2013.01); *H01L 24/13* (2013.01); *H01L 24/16* (2013.01);
(Continued)

(58) Field of Classification Search
CPC ............. H01L 21/4857; H01L 21/4853; H01L 21/481; H01L 23/49816; H01L 23/49838; H01L 24/81; H01L 24/16; H01L 2224/16227; H01L 2224/16237; H01L 23/66; H01L 23/3128
See application file for complete search history.

(56) References Cited

U.S. PATENT DOCUMENTS 6,930,389 B2 8/2005 Huang
7,244,671 B2 7/2007 Mis et al.
(Continued)

FOREIGN PATENT DOCUMENTS

CN 103035579 A 4/2013
TW 200524054 A 7/2005

*Primary Examiner* — Hoa B Trinh
(74) *Attorney, Agent, or Firm* — Foley & Lardner LLP

(57) ABSTRACT

A semiconductor package structure includes a first insulating layer, a first conductive layer, a multi-layered circuit structure, a protection layer, and a semiconductor chip electrically connected to the multi-layered circuit structure. The first insulating layer defines a first through hole extending through the first insulating layer. The first conductive layer includes a conductive pad disposed in the first through hole and a trace disposed on an upper surface of the first insulating layer. The multi-layered circuit structure is disposed on an upper surface of the first conductive layer. The multi-layered circuit structure includes a bonding region disposed on the conductive pad of the first conductive layer and an extending region disposed on the trace of the first conductive layer. The protection layer covers the upper surface of the first insulating layer and the extending region of the multi-layered circuit structure, and exposes the bonding region of the multi-layered circuit structure.

18 Claims, 11 Drawing Sheets

(51) Int. Cl.
*H01L 23/498* (2006.01)
*H01L 23/66* (2006.01)
*H01L 21/683* (2006.01)
*H01L 21/56* (2006.01)
*H01L 23/00* (2006.01)
*H01L 23/31* (2006.01)

(52) U.S. Cl.
CPC .............. *H01L 24/81* (2013.01); *H01L 24/97* (2013.01); *H01L 2221/68345* (2013.01); *H01L 2221/68359* (2013.01); *H01L 2223/6655* (2013.01); *H01L 2224/0401* (2013.01); *H01L 2224/131* (2013.01); *H01L 2224/16012* (2013.01); *H01L 2224/16227* (2013.01); *H01L 2224/16237* (2013.01); *H01L 2224/81005* (2013.01); *H01L 2224/81191* (2013.01); *H01L 2224/81385* (2013.01); *H01L 2224/81395* (2013.01); *H01L 2224/81444* (2013.01); *H01L 2224/81464* (2013.01); *H01L 2224/81801* (2013.01); *H01L 2224/97* (2013.01); *H01L 2924/1421* (2013.01); *H01L 2924/15311* (2013.01); *H01L 2924/3511* (2013.01); *H01L 2924/35121* (2013.01)

(56) References Cited

U.S. PATENT DOCUMENTS

| | | |
|---|---|---|
| 8,624,359 B2 | 1/2014 | Yang et al. |
| 9,598,876 B1 | 3/2017 | Lahood |
| 2009/0008765 A1* | 1/2009 | Yamano .................. H01L 24/83 257/690 |
| 2010/0297842 A1 | 11/2010 | Ke et al. |
| 2017/0179012 A1* | 6/2017 | Shimodaira ......... H01L 21/4853 |

* cited by examiner

SEMICONDUCTOR PACKAGE STRUCTURE AND METHOD FOR MANUFACTURING THE SAME

BACKGROUND

1. Field of the Disclosure

The present disclosure relates to a semiconductor package structure and a manufacturing method, and to a semiconductor package structure having a multi-layered circuit structure disposed on a first conductive layer, and a method for manufacturing the semiconductor package structure.

2. Description of the Related Art

In a package including a radio frequency (RF) chip, a redistribution layer (RDL) structure can be used to couple with the RF chip. Due to impedance matching concerns, such an RDL structure can be designed with a structure having five passivation layers and five metal layers (5P5M). A manufacturing process for a structure having one passivation layer and one metal layer (1P1M) can take about 10 days, and thus the manufacturing process for 5P5M structure can have a total manufacturing time of about 60 days. Thus, the manufacturing cost may be high. Further, such a 5P5M structure has a great thickness, which may readily cause warpage and/or delamination issues.

SUMMARY

In some embodiments, a semiconductor package structure includes a first insulating layer, a first conductive layer, a multi-layered circuit structure, a protection layer, and a semiconductor chip. The first insulating layer has an upper surface and a lower surface, and defines a first through hole extending through the first insulating layer. The first conductive layer has an upper surface, and includes a conductive pad disposed in the first through hole and a trace disposed on the upper surface of the first insulating layer. The multi-layered circuit structure is disposed on the upper surface of the first conductive layer. The multi-layered circuit structure includes a bonding region disposed on the conductive pad of the first conductive layer and an extending region disposed on the trace of the first conductive layer. The protection layer covers the upper surface of the first insulating layer and the extending region of the multi-layered circuit structure, and exposes the bonding region of the multi-layered circuit structure. The semiconductor chip is electrically connected to the multi-layered circuit structure.

In some embodiments, a method for manufacturing a semiconductor package structure includes (a) forming a first insulating layer and a first conductive layer, wherein the first insulating layer has an upper surface and defines a first through hole, and the first conductive layer has an upper surface and includes a conductive pad disposed in the first through hole and a trace extending on the upper surface of the first insulating layer; (b) forming a multi-layered circuit structure on the upper surface of the first conductive layer; (c) forming a protection layer covering the first insulating layer and the multi-layered circuit structure, and exposing a portion of the multi-layered circuit structure; and (d) bonding a semiconductor chip to the exposed portion of the multi-layered circuit structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
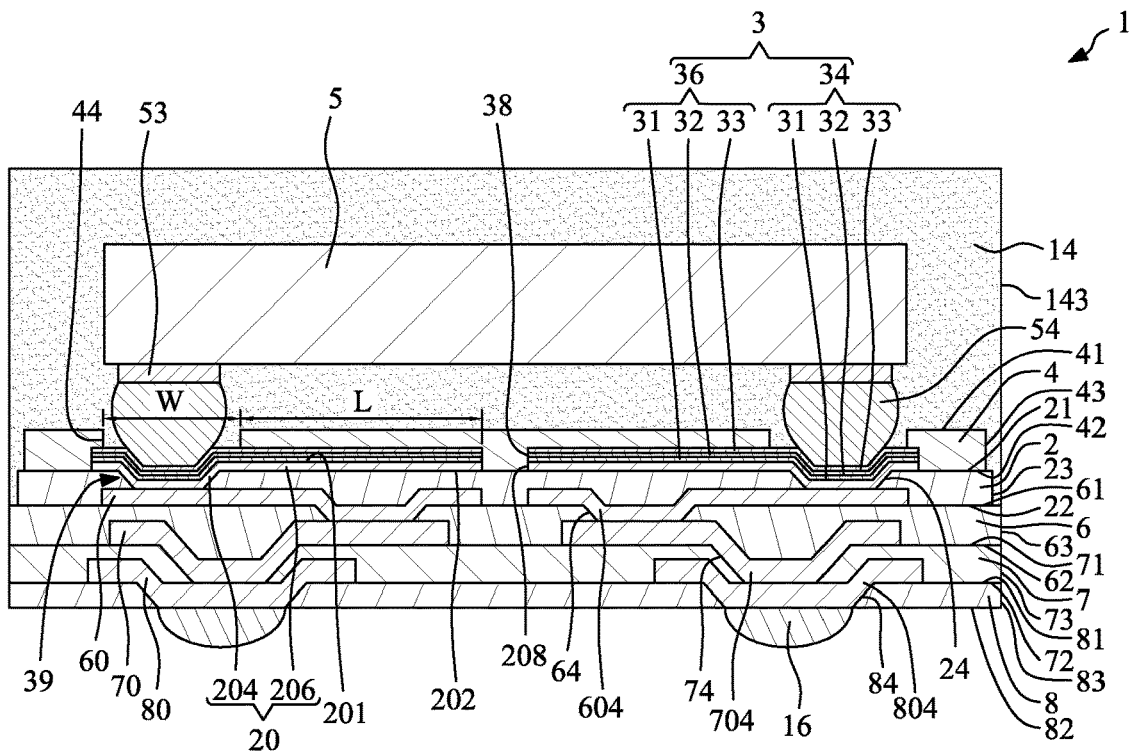
FIG. 1 illustrates a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a package including an RF chip, an RDL structure can be used to couple with the RF chip. Due to impedance matching concerns, such an RDL structure can be designed with a 5P5M structure. A comparative manufacturing process of such a 5P5M structure includes providing a carrier having a seed layer (or a release metal film) disposed thereon, forming a first passivation layer (P1) with a first through hole on the seed layer, forming a first metal layer (M1) on the P1 and in the first through hole, forming a second passivation layer (P2) with a second through hole on the P1 and covering the M1, forming a second metal layer (M2) on the P2 and in the second through hole to electrically connect the M1, and then sequentially forming a third passivation layer (P3), a third metal layer (M3), a fourth passivation layer (P4), a fourth metal layer (M4), a fifth passivation layer (P5) and a fifth metal layer (M5) in a similar manner. The M5 is an under bump metallization (UBM) for external connections. It is noted that the maximum width of the M5 is slightly greater than the maximum width of the fourth through hole of the P4. An area of the M5 from a top view is slightly greater than an area of the fourth through hole from a top view. For example, a ratio of the width of the portion of the M5 disposed on the top surface of the P4 to the maximum width of the fourth through hole of the P4 may be about ½ or more, or about ⅓ or more. An area of the M5 from a top view is much less than an area of the M4 from a top view. For example, a ratio of the area of the M5 from a top view to the area of the M4 from a top view may be about ½ or less, about ⅕ or less, or about 1/10 or less.

After formation of the 5P5M structure, at least one semiconductor chip is attached to the 5P5M structure, and an encapsulant is applied to cover the semiconductor chip and the 5P5M structure. Then, the carrier is removed, and the seed layer (or the release metal film) is removed by etching. Then, a singulation process is conducted to form a plurality of separate package structures. During the manufacturing process of such 5P5M structure, each of the five metal layers may be formed with a distinct patterned photoresist corresponding to the layout thereof, and thus the manufacturing process of such 5P5M structure uses five different photomasks. In addition, formation of a passivation layer and a metal layer can take about 10 days, and thus formation of 5P5M structure can have a total manufacture time of about 60 days. Thus, the manufacturing cost can be high. Further, such an 5P5M structure has a great thickness, which may readily cause warpage and/or delamination issues. Besides, in the comparative manufacturing process, the P1, P2, P3, P4 and P5 do not completely cover the seed layer (or the release metal film). For example, the P1 may define a first gap to expose the seed layer (or the release metal film). The position of the first gap may correspond to a saw street. Further, the P2 may define a second gap above the first gap, and a width of the second gap is greater than a width of the first gap. The P3 may define a third gap above the second gap, and a width of the third gap is greater than a width of the second gap. The P4 may define a fourth gap above the third gap, and a width of the fourth gap is greater than a width of the third gap. The P5 may define a fifth gap above the fourth gap, and a width of the fifth gap is greater than a width of the fourth gap. Hence, during the manufacturing process, undesired etching of the seed layer (or the release metal film) may occur before removal of the carrier, resulting in delamination of the P1 from the carrier before the 5P5M structure is finished.

The present disclosure addresses at least the above concerns and provides for an improved semiconductor package structure, and improved techniques for manufacturing the semiconductor package structure. In the semiconductor package structure, a multi-layered circuit structure is disposed on a first conductive layer directly to form a conductive metal layer. Thus, the cost of the manufacturing process is reduced.

FIG. 1 illustrates a cross-sectional view of a semiconductor package structure 1 according to some embodiments of the present disclosure. The semiconductor package structure 1 includes a first insulating layer 2, a first conductive layer 20, a multi-layered circuit structure 3, a protection layer 4, a semiconductor chip 5, an encapsulant 14, a second insulating layer 6, a second conductive layer 60, a third insulating layer 7, a third conductive layer 70, a fourth insulating layer 8, a fourth conductive layer 80, and a pre-solder 16.

The first insulating layer 2 has an upper surface 21, a lower surface 22 opposite the upper surface 21, and a side surface 23 extending between the upper surface 21 and the lower surface 22. The first insulating layer 2 defines a first through hole 24 extending through the first insulating layer 2. A material of the first insulating layer 2 may include an insulating material, a passivation material, a dielectric material or a solder resist material, such as, for example, a benzocyclobutene (BCB) based polymer or a polyimide (PI). In some embodiments, the first insulating layer 2 may include a cured photoimageable dielectric (PID) material, such as an epoxy or a PI including photoinitiators.

The first conductive layer 20 is disposed on the upper surface 21 of the first insulating layer 2 and in the first through hole 24 of the first insulating layer 2. The first conductive layer 20 has an upper surface 201, a lower surface 202 opposite the upper surface 201, and a peripheral wall 208 extending between the upper surface 201 and the lower surface 202. The lower surface 202 of the first conductive layer 20 is disposed on the upper surface 21 of the first insulating layer 2. The first conductive layer 20 includes a conductive pad 204 and a trace 206. The conductive pad 204 of the first conductive layer 20 is disposed in the first through hole 24 of the first insulating layer 2. The trace 206 is disposed on the upper surface 21 of the first insulating layer 2. In some embodiments, the conductive pad 204 and the trace 206 may be integrally formed as a monolithic structure. A material of the first conductive layer 20 may include, for example, copper, another conductive metal, or an alloy thereof. In some embodiments, the first conductive layer 20 may be a single layer, and a seed layer (e.g., titanium and/or copper, another metal, or an alloy) may be interposed between the first conductive layer 20 and the first insulating layer 2. Alternatively, the first conductive layer 20 may include a metal layer (e.g., a copper layer) and a seed layer.

The multi-layered circuit structure 3 is disposed on the upper surface 201 of the first conductive layer 20. The multi-layered circuit structure 3 includes a bonding region 34 and an extending region 36. The bonding region 34 is disposed on the conductive pad 204 of the first conductive layer 20, and the extending region 36 is disposed on the trace 206 of the conductive layer 20. In some embodiments, each layer of the multi-layered circuit structure 3 within the bonding region 34 and within the extending region 36 may be integrally formed as a monolithic structure. The bonding region 34 may be used as a UBM for electrical connections, such as connection with the semiconductor 5. As shown in FIG. 1, a length "L" of the extending region 36 is greater than a maximum width "W" of the bonding region 34 (e.g. by a factor of about 1.1 or more, about 1.2 or more, or about 1.3 or more). The multi-layered circuit structure 3 has a peripheral wall 38 which aligns with (e.g. is continuous with) the peripheral wall 208 of the first conductive layer 20. For example, the multi-layered circuit structure 3 may cover (e.g. substantially completely cover) the upper surface 201 of the first conductive layer 20. A layout of the multi-layered circuit structure 3 may be the same as, or similar to, the layout of the first conductive layer 20. In some embodiments, the first conductive layer 20 and the multi-layered circuit structure 3 may be formed by using a same photomask and/or a same photoresist. Thus, the multi-layered circuit structure 3 may be sputtered or plated on the upper surface 201 of the first conductive layer 20, and the multi-layered circuit structure 3 may be conformal with the first conductive layer 20. The multi-layered circuit structure 3 may include a barrier layer and/or a wetting layer. For example, as shown in FIG. 1, the multi-layered circuit structure 3 includes a first layer 31, a second layer 32 and a third layer 33. The first layer 31 may be a barrier layer disposed on the upper surface 201 of the first conductive layer 20, and may be formed by sputtering. A material of the first layer 31 includes, for example, nickel. The second layer 32 and the third layer 33 may be wetting layers sequentially disposed on the first layer 31, and may be formed by sputtering. Materials of the second layer 32 and the third layer 33 include, for example, palladium and/or gold. The layouts of the first layer 31, the second layer 32 and the third layer 33 may be the same as, or similar to, the layout of the first conductive layer 20. In embodiments in which the multi-layered circuit structure 3 includes nickel and/or palladium, warpage of the semiconductor package structure 1 corresponding to the conductive layers (e.g., the first conductive layer 20, the second conductive layer 60, the third conductive layer 70 and/or the fourth conductive layer 80) can be balanced.

The protection layer 4 covers the upper surface 21 of the first insulating layer 2 and the extending region 36 of the multi-layered circuit structure 3. The protection layer 4 defines at least one through hole 44 to expose the bonding region 34 of the multi-layered circuit structure 3. A width "W" of the through hole 44 is substantially equal to the maximum width "W" of the bonding region 34 of the multi-layered circuit structure 3. The protection layer 4 has an upper surface 41, a lower surface 42 opposite the upper surface 41, and a side surface 43 extending between the upper surface 41 and the lower surface 42. The lower surface 42 is disposed on the upper surface 21 of the first insulating layer 2. The side surface 23 of the first insulating layer 2 is not coplanar with the side surface 43 of the protection layer 4. The protection layer 4 covers the peripheral wall 208 of the first conductive layer 20 and the peripheral wall 38 of the multi-layered circuit structure 3. A material of the protection layer 4 may be the same as, or similar to, the material of the first insulating layer 2.

The semiconductor chip 5 is electrically connected to the multi-layered circuit structure 3. At least one solder bump 54 connects the semiconductor chip 5 and the multi-layered circuit structure 3. For example, the semiconductor 5 includes at least one bump pad 53, and the solder bump 54 is disposed on the bonding region 34 of the multi-layered circuit structure 3 and connects to the bump pad 53 of the semiconductor chip 5.

The encapsulant 14, which can be, for example, a molding compound, is disposed on the protection layer 4 and encapsulates and covers the semiconductor chip 5 and the solder bump 54. The encapsulant 14 has a side surface 143, and the side surface 143 is not coplanar with the side surface 43 of the protection layer 4 or the side surface 23 of the first insulating layer 2. In some embodiments, as shown in FIG. 1, the encapsulant 14 covers the side surface 23 of the first insulating layer 2 and the side surface 43 of the protection layer 4.

The second insulating layer 6 and the second conductive layer 60 are disposed adjacent the lower surface 22 of the first insulating layer 2. The second insulating layer 6 has an upper surface 61, a lower surface 62 opposite the upper surface 61, and a side surface 63 extending between the upper surface 61 and the lower surface 62. The upper surface 61 of the second insulating layer 6 is disposed on the lower surface 22 of the first insulating layer 2. The side surface 63 of the second insulating layer 6 is not coplanar with the side surface 23 of the first insulating layer 2. The side surface 63 of the second insulating layer 6 is not coplanar with the side surface 43 of the protection layer 4. The side surface 63 of the second insulating layer 6 is substantially coplanar with the side surface 143 of the encapsulant 14. The second insulating layer 6 defines a second through hole 64 extending through the second insulating layer 6. A material of the second insulating layer 6 may be the same as, or similar to, the material of the first insulating layer 2.

The second conductive layer 60 is disposed on the upper surface 61 of the second insulating layer 6 and embedded in or covered by the first insulating layer 2. The second conductive layer 60 extends into the second through hole 64 of the second insulating layer 6 to form a second conductive via 604. That is, the second conductive via 604 of the second conductive layer 60 extends through the second insulating layer 6. A portion of the extending region 36 of the multi-layered circuit structure 3 is disposed directly above the second conductive via 604 of the second conductive layer 60. The first conductive layer 20 is electrically connected to the second conductive layer 60 through a first conductive via 39 including at least a portion of the bonding region 34 of the multi-layered circuit structure 3 and at least a portion of the conductive pad 204 of the first conductive layer 20 in the first through hole 24 of the first insulating layer 2. In addition, an area of the multi-layered circuit structure 3 from a top view is in a range of about 0.5 times to about 1.5 times, about 0.7 times to about 1.3 times, about 0.9 times to about 1.1 times, or about 0.95 times to about 1.05 times as large as an area of the second conductive layer 60 from a top view. A material of the second conductive layer 60 may be the same as, or similar to, the material of the first conductive layer 20. In some embodiments, as shown in FIG. 1, a sum of a cross-sectional area of the multi-layered circuit structure 3 and a cross-sectional area of the first conductive layer 20 is in a range of about 0.5 times to about 1.5 times, about 0.7 times to about 1.3 times, about 0.9 times to about 1.1 times, or about 0.95 times to about 1.05 times as large as a cross-sectional area of the second conductive layer 60.

The third insulating layer 7 and the fourth insulating layer 8 are sequentially disposed on the second insulating layer 6. The third insulating layer 7 has an upper surface 71, a lower surface 72 opposite the upper surface 71, and a side surface 73 extending between the upper surface 71 and the lower surface 72. The upper surface 71 of the third insulating layer 7 is disposed on the lower surface 62 of the second insulating layer 6. The side surface 63 of the second insulating layer 6 and the side surface 73 of the third insulating layer 7 are substantially coplanar. The third insulating layer 7 defines a third through hole 74 extending through the third insulating layer 7. A material of the third insulating layer 7 may be the same as, or similar to, the material of the first insulating layer 2.

The third conductive layer 70 is disposed on the upper surface 71 of the third insulating layer 7, and embedded in or covered by the second insulating layer 6. The third conductive layer 70 extends into the third through hole 74 of the third insulating layer 7 to form a third conductive via 704. The third conductive via 704 of the third conductive layer 70 extends through the third insulating layer 7. The third conductive layer 70 is electrically connected to the second conductive layer 60 through the second conductive via 604 of the second conductive layer 60. A material of the third conductive layer 70 may be the same as, similar to, the material of the first conductive layer 20.

The fourth insulating layer 8 has an upper surface 81, a lower surface 82 opposite the upper surface 81, and a side surface 83 extending between the upper surface 81 and the lower surface 82. The upper surface 81 of the fourth insulating layer 8 is disposed on the lower surface 72 of the third insulating layer 7. The side surface 73 of the third insulating layer 7 and the side surface 83 of the fourth insulating layer 8 are substantially coplanar. The fourth insulating layer 8 defines a fourth through hole 84 extending through the fourth insulating layer 8. A material of the fourth insulating layer 8 may be the same as, or similar to, the material of the first insulating layer 2.

The fourth conductive layer 80 is disposed on the upper surface 81 of the fourth insulating layer 8, and embedded in or covered by the third insulating layer 7. The fourth conductive layer 80 extends into the fourth through hole 84 of the fourth insulating layer 8 to form a fourth conductive via 804. The fourth conductive via 804 of the fourth conductive layer 80 extends through the fourth insulating layer 8. The fourth conductive layer 80 is electrically connected to the third conductive layer 70 through the third conductive via 704 of the third conductive layer 70. A material of the fourth conductive layer 80 may be the same as, or similar to, the material of the first conductive layer 20. In some embodiments, a thickness of the second conductive layer 60, a thickness of the third conductive layer 70 and a thickness of the fourth conductive layer 80 may be substantially equal to each other, while a thickness of the first conductive layer 20 may be less than the thickness of the second conductive layer 60, the thickness of the third conductive layer 70 and/or the thickness of the fourth conductive layer 80. For example, a ratio of the thickness of the first conductive layer 20 to the thickness of the second conductive layer 60 may be about ⅔ or less, about ½ or less, or about ⅓ or less.

The pre-solder 16 is disposed on a side of the fourth conductive via 804 adjacent to the second surface 82 of the fourth insulating layer 8 for external connections.

In the semiconductor package structure 1, since the multi-layered circuit structure 3 is directly disposed on the first conductive layer 20 (and may not be disposed on the first conductive layer 20 via another conductive metal layer), the semiconductor package structure 1 includes four conductive metal layers rather than five conductive metal layers. Thus, a metal layer can be omitted, and a formation time of the semiconductor package structure 1 can be reduced, and the manufacturing cost can be reduced. In addition, a total thickness of the semiconductor package structure 1 can be reduced. Besides, the multi-layered circuit structure 3 and the first conductive layer 20 can be formed by using a same photomask and/or a same photoresist, and thus the manufacturing cost of the semiconductor package structure 1 can be reduced.

Figure 2:
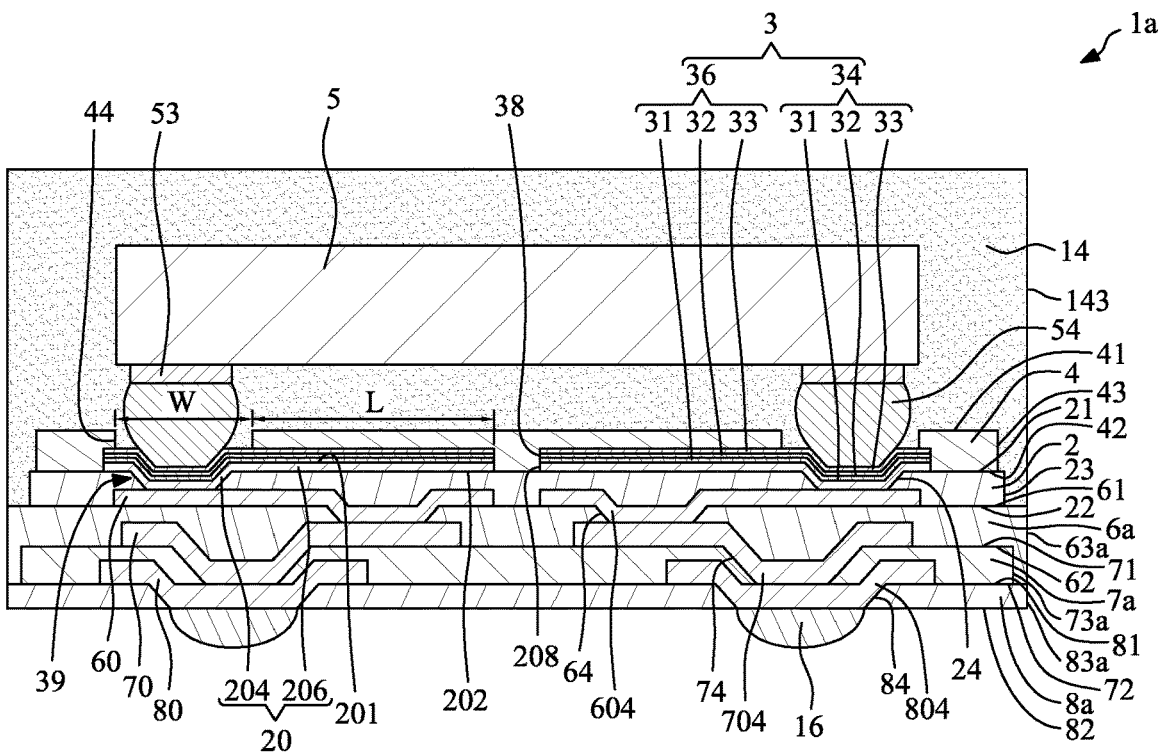
FIG. 2 illustrates a cross-sectional view of an example of a semiconductor package structure according to some embodiments of the present disclosure.

FIG. 2 illustrates a cross-sectional view of a semiconductor package structure 1a according to some embodiments of the present disclosure. The semiconductor package structure 1a is similar to the semiconductor package structure 1 shown in FIG. 1, except that the semiconductor package structure 1a shown in FIG. 2 includes a second insulating layer 6a, a third insulating layer 7a and a fourth insulating layer 8a instead of the second insulating layer 6, the third insulating layer 7 and the fourth insulating layer 8 of the semiconductor package structure 1 shown in FIG. 1.

As shown in FIG. 2, the second insulating layer 6a, the third insulating layer 7a and the fourth insulating layer 8a are similar to the second insulating layer 6, the third insulating layer 7 and the fourth insulating layer 8 of the semiconductor package structure 1 shown in FIG. 1. However, in the semiconductor package structure 1a shown in FIG. 2, a side surface 63a of the second insulating layer 6a and a side surface 83a of the fourth insulating layer 8a are substantially coplanar, and the second insulating layer 6a covers a side surface 73a of the third insulating layer 7a.

FIG. 3 through FIG. 20 illustrate a method for manufacturing a semiconductor package structure according to some embodiments of the present disclosure. In some embodiments, the method is for manufacturing a semiconductor package structure such as the semiconductor package structure 1 shown in FIG. 1.

Figure 3:
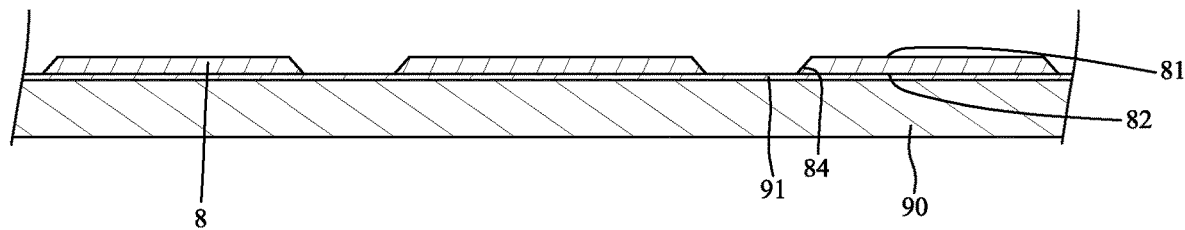
FIG. 3 illustrates one or more stages of an example of a method for manufacturing a semiconductor package structure according to some embodiments of the present disclosure.

Referring to FIG. 3, a carrier 90 is provided. The carrier 90 may include a release film disposed thereon, such as a release metal film. Then, a seed layer 91 is formed on the carrier 90. Then, a fourth insulating layer 8 is formed on the seed layer 90. At a position corresponding to a saw street 98 (shown in FIG. 20), the fourth insulating layer 8 may cover the seed layer 91 to avoid undesired etching of the seed layer 91 before the carrier 90 is removed. The fourth insulating layer 8 has an upper surface 81 and a lower surface 82 opposite the upper surface 81. The lower surface 82 of the fourth insulating layer 8 is disposed on the carrier 90. The fourth insulating layer 8 defines at least one fourth through hole 84 to expose a portion of the seed layer 91. The fourth through hole 84 is used for receiving a fourth conductive via 804 (shown in FIG. 6). A material of the fourth insulating layer 8 may include an insulating material, a passivation material, a dielectric material or a solder resist material, such as, for example, a BCB based polymer or a PI. In some embodiments, the fourth insulating layer 8 may include a cured PID material, such as an epoxy or a PI including photoinitiators.

Figure 4:
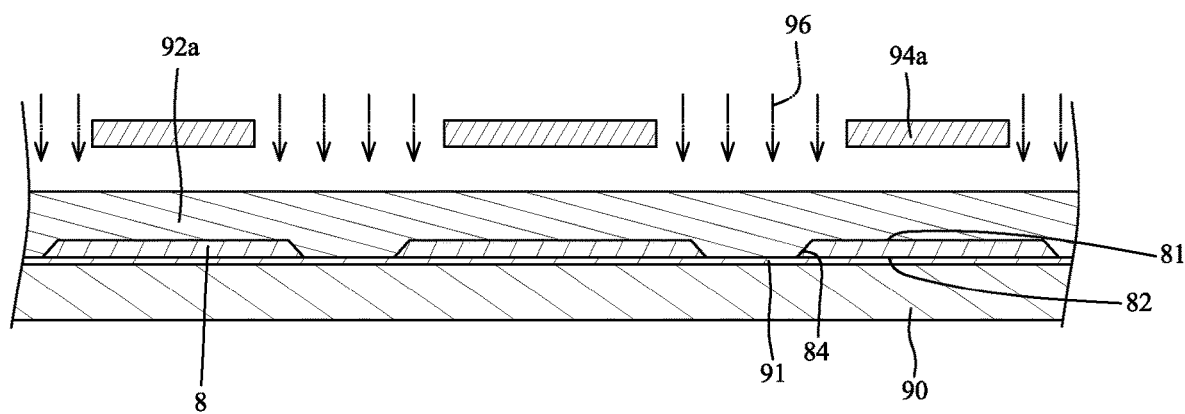
FIG. 4 illustrates one or more stages of an example of a method for manufacturing a semiconductor package structure according to some embodiments of the present disclosure.

Referring to FIG. 4, a first photoresist layer 92a is disposed on the fourth insulating layer 8. Then, the first photoresist layer 92a is exposed to a pattern of intense light. For example, a first photomask 94a is disposed adjacent to the first photoresist layer 92a, so as to cover a portion of the first photoresist layer 92a. Then, the first photoresist layer 92a is exposed to a radiation source 96.

Figure 5:
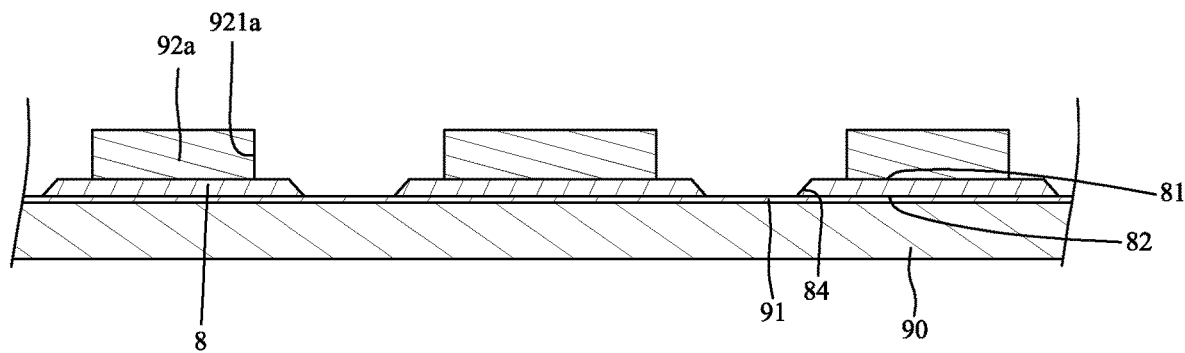
FIG. 5 illustrates one or more stages of an example of a method for manufacturing a semiconductor package structure according to some embodiments of the present disclosure.

Referring to FIG. 5, the first photoresist layer 92a is then developed by a developer. That is, the first photoresist layer 92a is patterned to define a plurality of openings 921a to expose portions of the fourth insulating layer 8, including the fourth through hole 84 of the fourth insulating layer 8.

Figure 6:
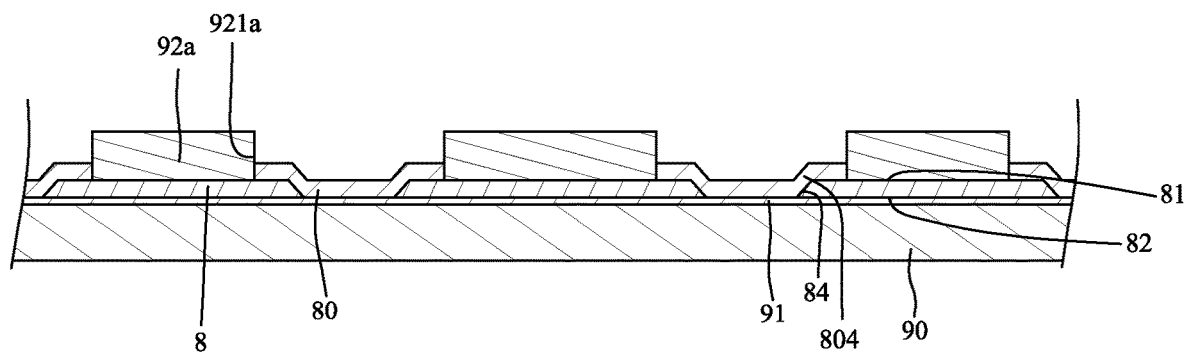
FIG. 6 illustrates one or more stages of an example of a method for manufacturing a semiconductor package structure according to some embodiments of the present disclosure.

Referring to FIG. 6, a fourth conductive layer 80 is formed in the openings 921a of the first photoresist layer 92a and on the fourth insulating layer 8. The fourth conductive layer 80 is disposed on the upper surface 81 of the fourth insulating layer 8. The fourth conductive layer 80 extends into the fourth through hole 84 of the fourth insulating layer 8 to form a fourth conductive via 804. The fourth conductive via 804 of the fourth conductive layer 80 extends through the fourth insulating layer 8. A material of the fourth conductive layer 80 may include, for example, copper, another conductive metal, or an alloy thereof. In some embodiments, the fourth conductive layer 80 may be a single layer, and a seed layer (e.g., titanium and/or copper, another metal, or an alloy) may be interposed between the fourth conductive layer 80 and the fourth insulating layer 8. Alternatively, the fourth conductive layer 80 may include a metal layer (e.g., a copper layer) and a seed layer.

Figure 7:
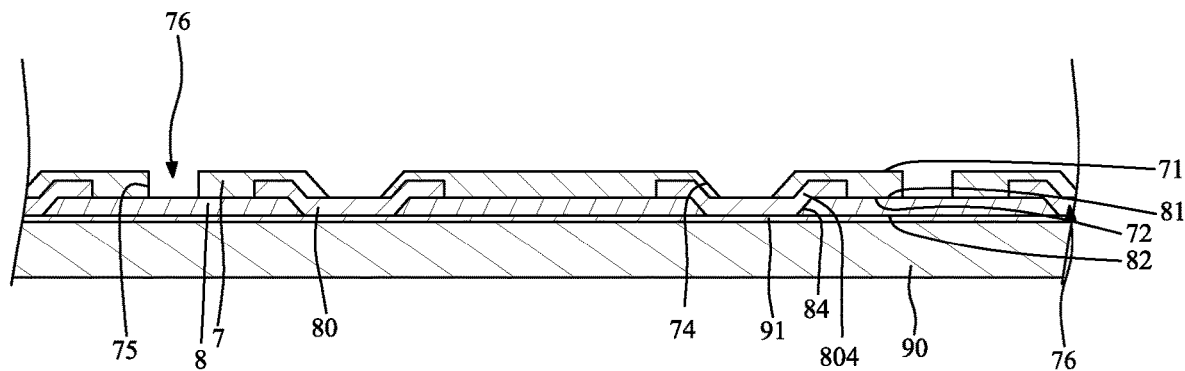
FIG. 7 illustrates one or more stages of an example of a method for manufacturing a semiconductor package structure according to some embodiments of the present disclosure.
Figure 12:
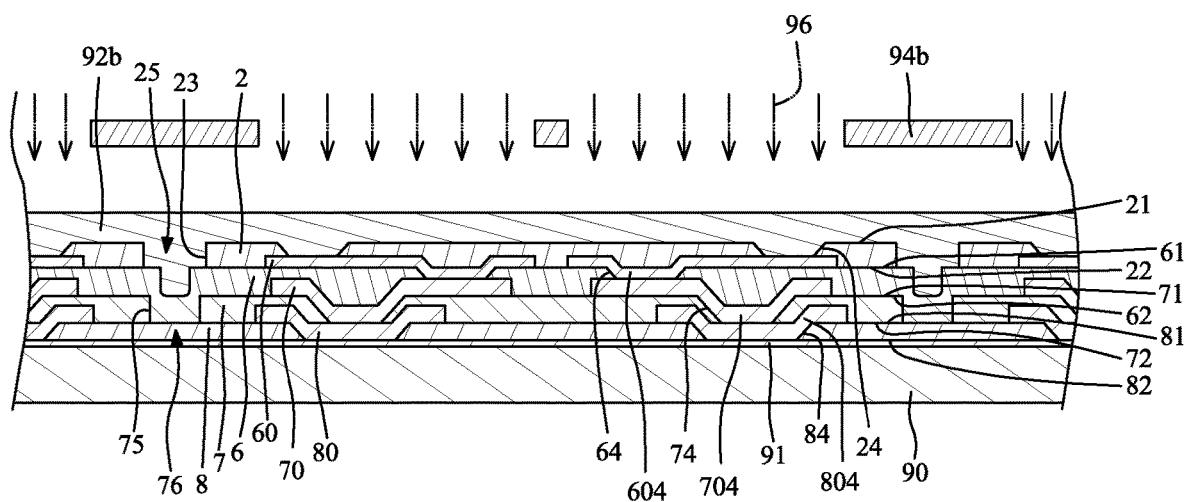
FIG. 12 illustrates one or more stages of an example of a method for manufacturing a semiconductor package structure according to some embodiments of the present disclosure.

Referring to FIG. 7, the first photoresist layer 92a is removed, and a third insulating layer 7 is formed on and covers the fourth insulating layer 8 and the fourth conductive layer 80. The third insulating layer 7 has an upper surface 71 and a lower surface 72 opposite the upper surface 71. The lower surface 72 of the third insulating layer 7 is disposed on the upper surface 81 of the fourth insulating layer 8. The third insulating layer 7 defines a third through hole 74 extending through the third insulating layer 7. The third through hole 74 may expose a portion of the fourth conductive layer 80. The third insulating layer 7 further has a lateral surface 75 defining a gap 76 to expose a portion of the fourth insulating layer 8. The position of the gap 76 corresponds to the position of the saw street 98 (as shown in FIG. 12) A material of the third insulating layer 7 may be the same as, or similar to, the material of the fourth insulating layer 8.

Figure 8:
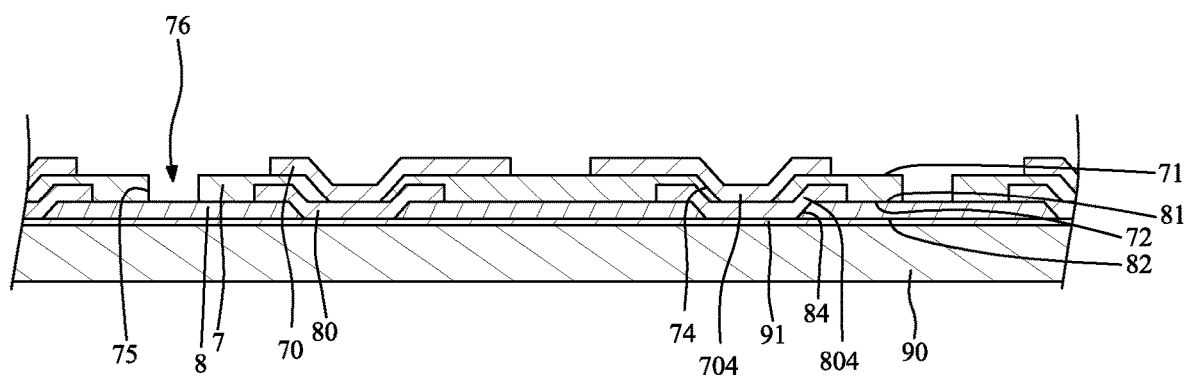
FIG. 8 illustrates one or more stages of an example of a method for manufacturing a semiconductor package structure according to some embodiments of the present disclosure.

Referring to FIG. 8, a third conductive layer 70 is formed on the third insulating layer 7. The third conductive layer 70 is disposed on the upper surface 71 of the third insulating layer 7. The third conductive layer 70 extends into the third through hole 74 of the third insulating layer 7 to form a third conductive via 704. The third conductive via 704 of the third conductive layer 70 extends through the third insulating layer 7. The third conductive layer 70 is electrically connected to the fourth conductive layer 80 through the third conductive via 704. A material of the third conductive layer 70 may be the same as, or similar to, the material of the fourth conductive layer 80.

Figure 9:
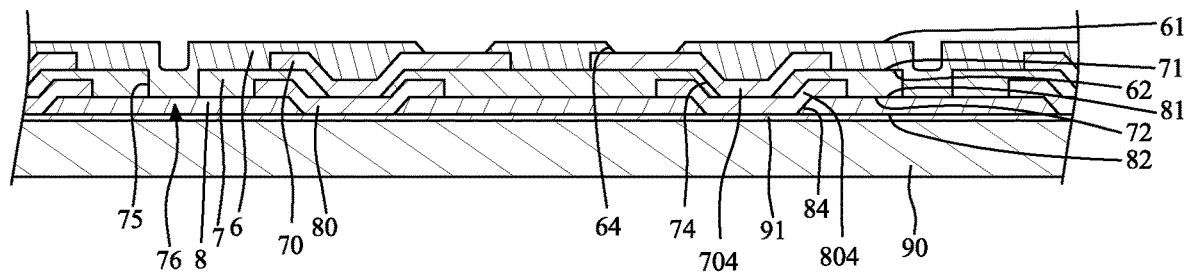
FIG. 9 illustrates one or more stages of an example of a method for manufacturing a semiconductor package structure according to some embodiments of the present disclosure.

Referring to FIG. 9, a second insulating layer 6 is formed on and covers the third insulating layer 7 and the second conductive layer 70. A portion of the second insulating layer 6 extends into and fills the gap 76 of the third insulating layer 7. The second insulating layer 6 has an upper surface 61 and a lower surface 62 opposite the upper surface 61. The lower surface 62 of the second insulating layer 6 is disposed on the upper surface 71 of the third insulating layer 7. The second insulating layer 6 defines a second through hole 64 extending through the second insulating layer 6 to expose a portion of the third conductive layer 70. A material of the second insulating layer 6 may be the same as, or similar to, the material of the fourth insulating layer 8.

Figure 10:
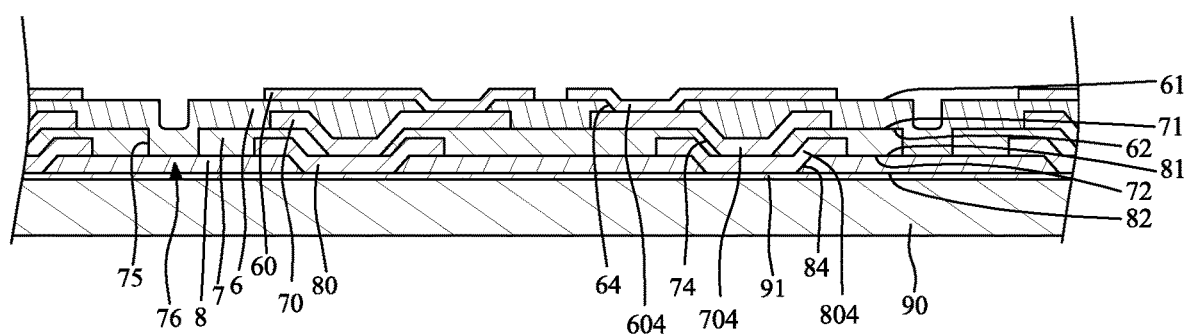
FIG. 10 illustrates one or more stages of an example of a method for manufacturing a semiconductor package structure according to some embodiments of the present disclosure.

Referring to FIG. 10, a second conductive layer 60 is formed on the second insulating layer 6. The second conductive layer 60 is disposed on the upper surface 61 of the second insulating layer 6. The second conductive layer 60 extends into the second through hole 64 of the second insulating layer 6 to form a second conductive via 604. That is, the second conductive via 604 of the second conductive layer 60 extends through the second insulating layer 6. The second conductive layer 60 is electrically connected to the third conductive layer 70 through the second conductive via 604. A material of the second conductive layer 60 may be the same as, or similar to, the material of the fourth conductive layer 80.

Figure 11:
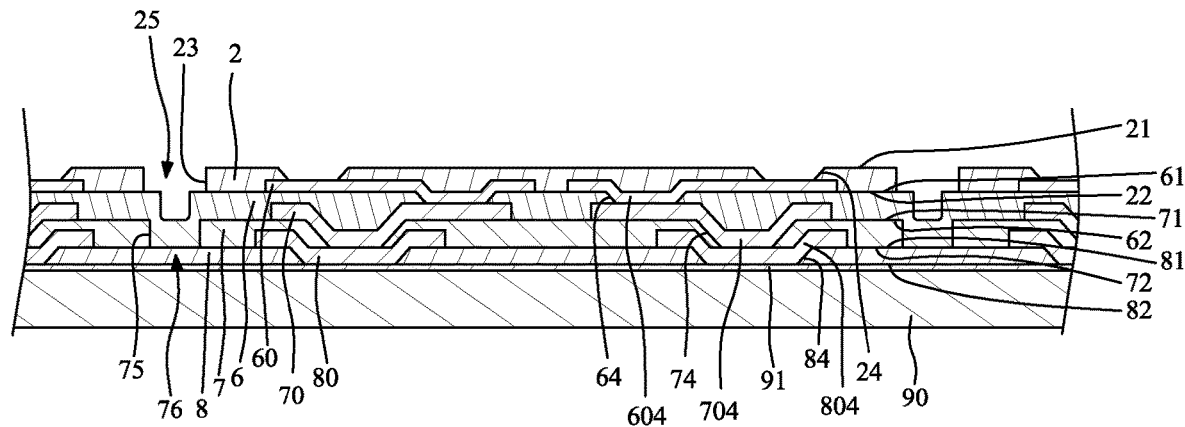
FIG. 11 illustrates one or more stages of an example of a method for manufacturing a semiconductor package structure according to some embodiments of the present disclosure.

Referring to FIG. 11, a first insulating layer 2 is formed on and covers the second insulating layer 6 and the second conductive layer 60. The first insulating layer 2 has an upper surface 21, a lower surface 22 opposite the upper surface 21, and a side surface 23 extending between the upper surface 21 and the lower surface 22. Two adjacent side surfaces 23 may define a gap 25 corresponding to the gap 76 of the third insulating layer 7. The gap 25 may extend through the first insulating layer 2 to expose the second insulating layer 6, and is disposed directly above the gap 76 of the third insulating layer 7. In addition, the first insulating layer 2 further defines a first through hole 24 extending through the first insulating layer 2 to expose a portion of the second conductive layer 60.

Referring to FIG. 12, a second photoresist layer 92b is disposed on the first insulating layer 2. Then, the second photoresist layer 92b is exposed to a pattern of intense light. For example, a second photomask 94b is disposed adjacent to the second photoresist layer 92b, so as to cover a portion of the second photoresist layer 92b. Then, the second photoresist layer 92b is exposed to a radiation source 96.

Figure 13:
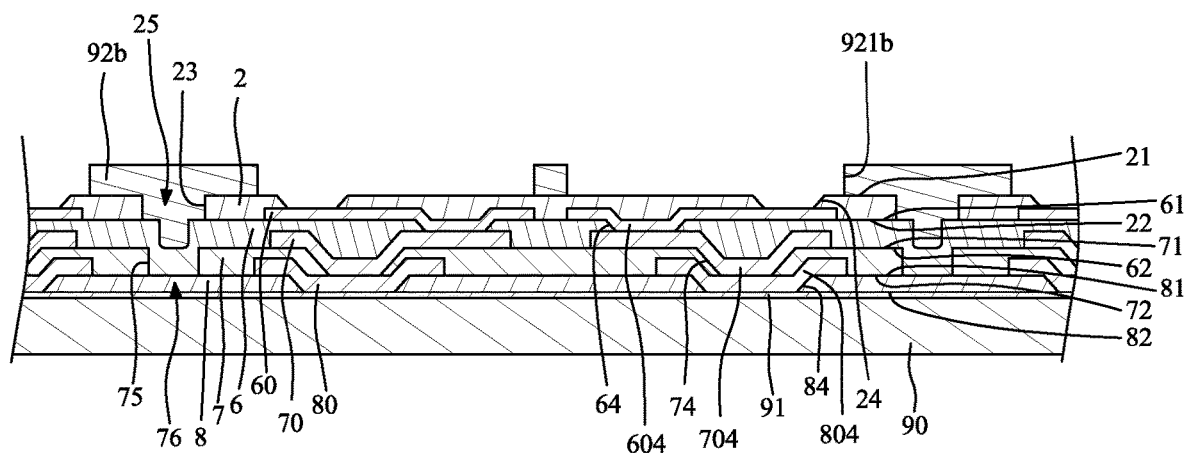
FIG. 13 illustrates one or more stages of an example of a method for manufacturing a semiconductor package structure according to some embodiments of the present disclosure.

Referring to FIG. 13, the second photoresist layer 92b is then developed by a developer. That is, the second photoresist layer 92b is patterned to define a plurality of openings 921b to expose portions of the first insulating layer 2.

Figure 14:
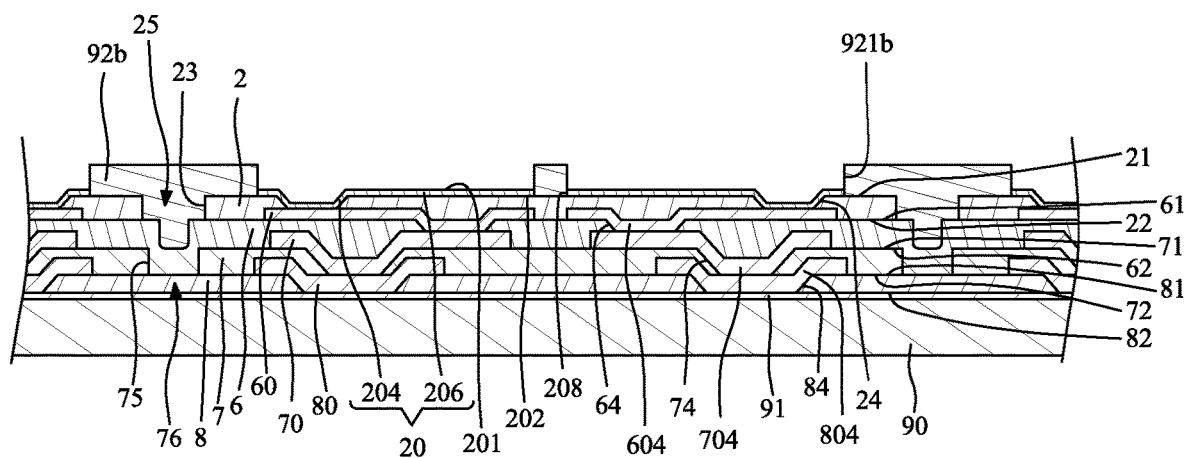
FIG. 14 illustrates one or more stages of an example of a method for manufacturing a semiconductor package structure according to some embodiments of the present disclosure.

Referring to FIG. 14, a first conductive layer 20 is formed in the openings 921b of the second photoresist layer 92b and on the first insulating layer 2. The first conductive layer 20 is disposed on the upper surface 21 of the first insulating layer 2 and in the first through hole 24 of the first insulating layer 2. The first conductive layer 20 has an upper surface 201, a lower surface 202 opposite the upper surface 201, and a peripheral wall 208 extending between the upper surface 201 and the lower surface 202. The lower surface 202 of the first conductive layer 20 is disposed on the upper surface 21 of the first insulating layer 2. The first conductive layer 20 includes a conductive pad 204 and a trace 206. The conductive pad 204 of the first conductive layer 20 is disposed in the first through hole 24 of the first insulating layer 2. The trace 206 extends on the upper surface 21 of the first insulating layer 2. A material of the first conductive 20 layer may be the same as, or similar to, the material of the fourth conductive layer 80. In some embodiments, a thickness of the second conductive layer 60, a thickness of the third conductive layer 70 and a thickness of the fourth conductive layer 80 may be substantially the same as each other, while a thickness of the first conductive layer 20 may be less than the thickness of the second conductive layer 60, the thickness of the third conductive layer 70 and/or the thickness of the fourth conductive layer 80. For example, a ratio of the thickness of the first conductive layer 20 to the thickness of the second conductive layer 60 may be about ⅔ or less, about ½ or less, or about ⅓ or less.

Figure 15:
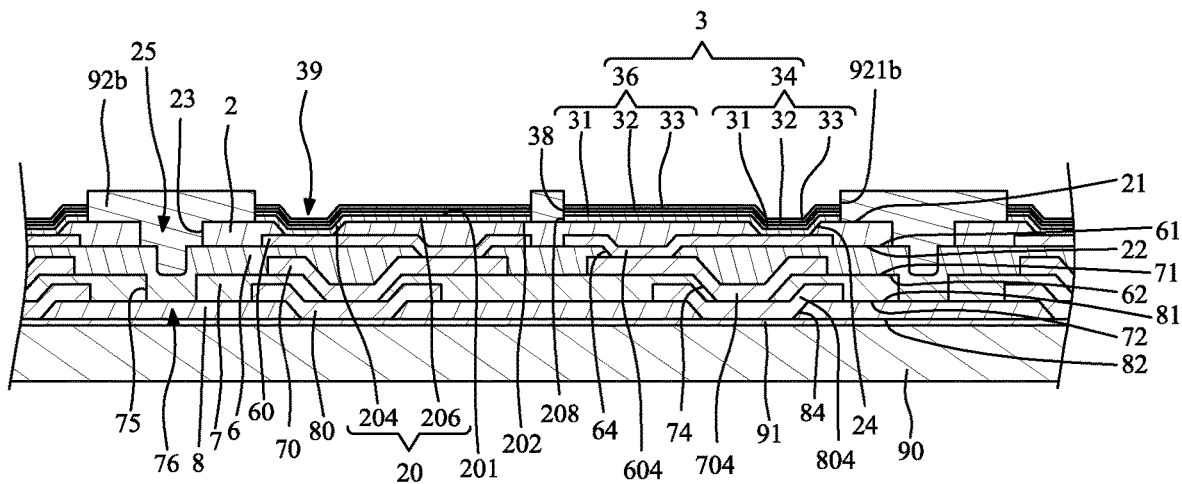
FIG. 15 illustrates one or more stages of an example of a method for manufacturing a semiconductor package structure according to some embodiments of the present disclosure.

Referring to FIG. 15, a multi-layered circuit structure 3 is formed in the openings 921b of the second photoresist 92b and on the upper surface 201 of the first conductive layer 20. For example, the multi-layered circuit structure 3 may be formed by sputtering or plating. As shown in FIGS. 14 and 15, the first conductive layer 20 and the multi-layered circuit structure 3 are formed using the same photoresist 92b. That is, the first conductive layer 20 and the multi-layered circuit structure 3 are formed by using the same photomask 94b. Thus, the multi-layered circuit structure 3 may be sputtered or plated on the upper surface 201 of the first conductive layer 20, and the multi-layered circuit structure 3 may be conformal with the first conductive layer 20. In addition, an area of the multi-layered circuit structure 3 from a top view is in a range of about 0.5 times to about 1.5 times, or about 0.7 times to about 1.2 times as large as an area of the second conductive layer 60 from a top view. The multi-layered circuit structure 3 includes a bonding region 34 and an extending region 36. The bonding region 34 is disposed on the conductive pad 204 of the first conductive layer 20, and the extending region 36 is disposed on the trace 206 of the conductive layer 20. The first conductive layer 20 is electrically connected to the second conductive layer 60 through a first conductive via 39 including the conductive pad 204 in the first through hole 24 of the first insulating layer 2. The multi-layered circuit structure 3 has a peripheral wall 38 which aligns with (e.g. is substantially coplanar with) the peripheral wall 208 of the first conductive layer 20. For example, the multi-layered circuit structure 3 may cover the upper surface 201 of the first conductive layer 20. A layout of the multi-layered circuit structure 3 may be the same as, or similar to, a layout of the first conductive layer 20. The multi-layered circuit structure 3 may include a barrier layer and/or a wetting layer. For example, as shown in FIG. 15, the multi-layered circuit structure 3 includes a first layer 31, a second layer 32 and a third layer 33 sequentially disposed on the first conductive layer 20. The first layer 31 may be a barrier layer disposed on the upper surface 201 of the first conductive layer 20. A material of the first layer 31 includes, for example, nickel. The second layer 32 and the third layer 33 may be wetting layers sequentially disposed on the first layer 31. Materials of the second layer 32 and the third layer 33 include, for example, palladium and/or gold. The layouts of the first layer 31, the second layer 32 and the third layer 33 may be the same as, or similar to, the layout of the first conductive layer 20. In the embodiment that the multi-layered circuit structure 3 includes nickel and/or palladium, warpage of the semiconductor package structure 1 corresponding to the conductive layers (e.g., the first conductive layer 20, the second conductive layer 60, the third conductive layer 70 and/or the fourth conductive layer 80) can be balanced.

Figure 16:
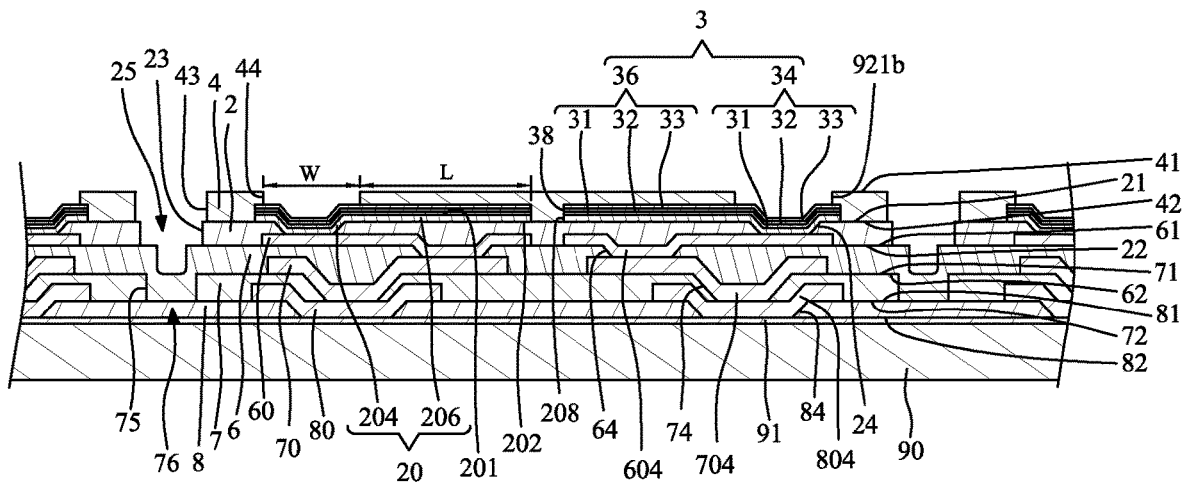
FIG. 16 illustrates one or more stages of an example of a method for manufacturing a semiconductor package structure according to some embodiments of the present disclosure.

Referring to FIG. 16, the second photoresist 92b is removed, and a protection layer 4 is formed on the first insulating layer 2. The protection layer 4 covers the first insulating layer 2 and the multi-layered circuit structure 3, and exposes a portion of the multi-layered circuit structure 3. For example, the protection layer 4 covers the upper surface 21 of the first insulating layer 2 and the extending region 36 of the multi-layered circuit structure 3. The protection layer 4 defines at least one through hole 44 to expose the bonding region 34 of the multi-layered circuit structure 3. As shown in FIG. 16, a length "L" of the extending region 36 is greater than a maximum width "W" of the bonding region 34 (e.g. by a ratio of about 1.1 or more, about 1.2 or more, or about 1.3 or more). A width "W" of the through hole 44 is substantially equal to the maximum width "W" of the bonding region 34 of the multi-layered circuit structure 3. The protection layer 4 has an upper surface 41, a lower surface 42 opposite the upper surface 41, and a side surface 23 extending between the upper surface 41 and the lower surface 42. The lower surface 42 is disposed on the upper surface 21 of the first insulating layer 2. The side surface 43 of the protection layer 4 is not coplanar with the side surface 23 of the first insulating layer 2. The protection layer 4 covers the peripheral wall 208 of the first conductive layer 20 and the peripheral wall 38 of the multi-layered circuit structure 3. A material of the protection layer 4 may be the same as, or similar to, the material of the fourth insulating layer 8.

Figure 17:
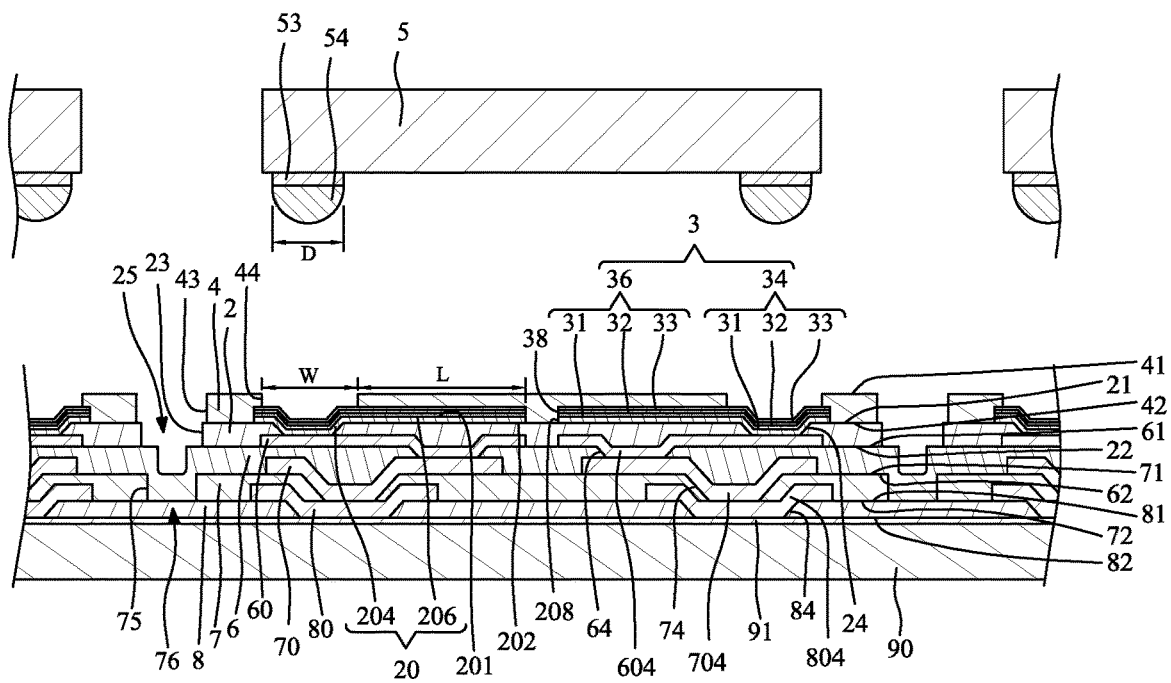
FIG. 17 illustrates one or more stages of an example of a method for manufacturing a semiconductor package structure according to some embodiments of the present disclosure.
Figure 18:
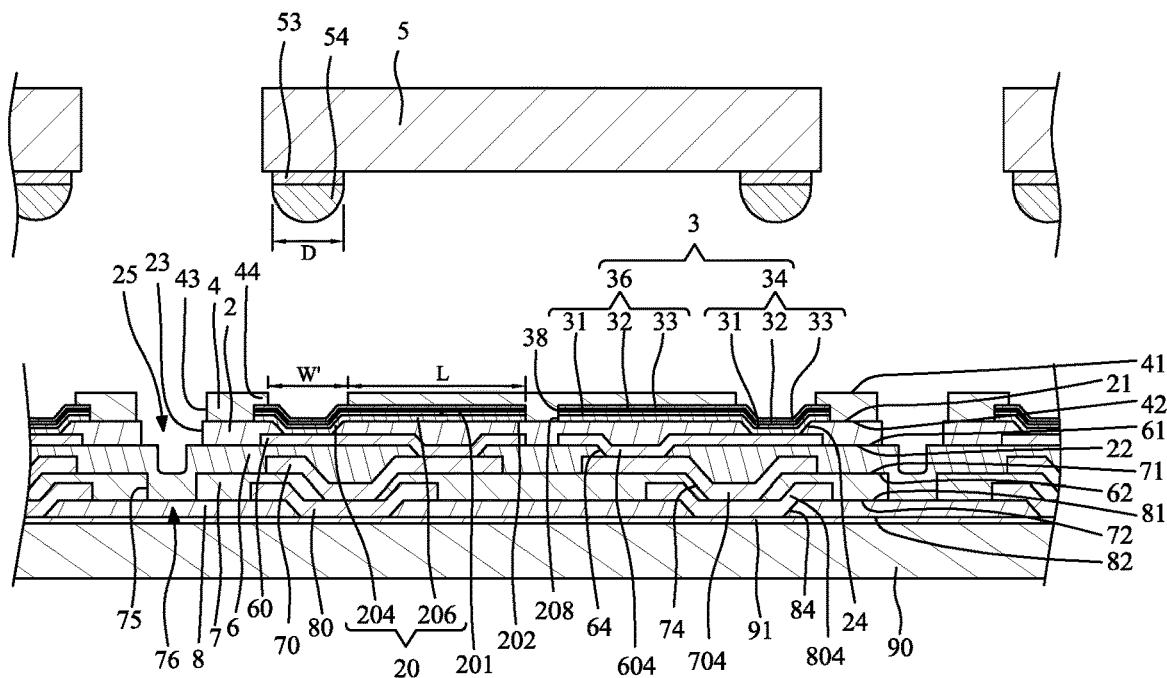
FIG. 18 illustrates one or more stages of an example of a method for manufacturing a semiconductor package structure according to some embodiments of the present disclosure.

Referring to FIG. 17, a semiconductor chip 5 is provided. The semiconductor chip 5 includes at least one bump pad 53, and at least one solder bump 54 is disposed on the bump pad 53. In some embodiments, as shown in FIG. 17, a diameter "W" of the exposed portion (e.g., the bonding region 34) of the multi-layered circuit structure 3 is slightly greater than a maximum diameter "D" of the solder bump 54 (e.g. by a ratio of about 1.1 or more, about 1.2 or more, or about 1.3 or more). Alternatively, in other embodiments, such as shown in FIG. 18, the diameter "W'" of the exposed portion (e.g., the bonding region 34) of the multi-layered circuit structure 3 may substantially equal to the maximum diameter "D" of the solder bump 54.

Figure 19:
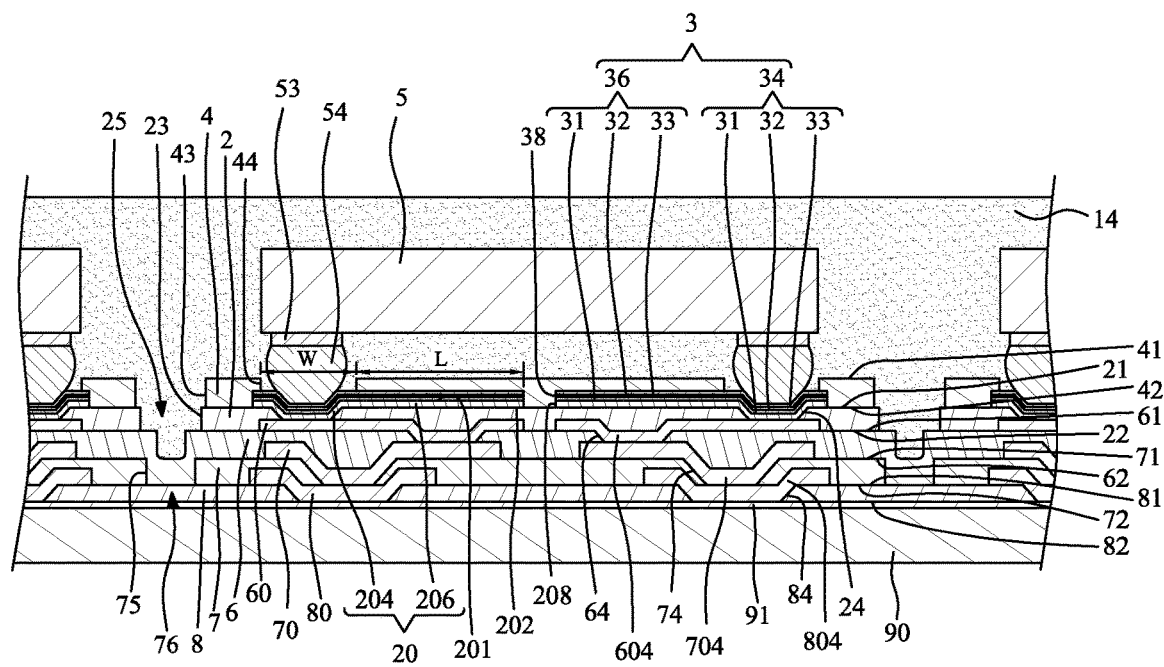
FIG. 19 illustrates one or more stages of an example of a method for manufacturing a semiconductor package structure according to some embodiments of the present disclosure.

Referring to FIG. 19, the semiconductor chip 5 is bonded to the exposed portion of the multi-layered circuit structure 3. For example, the semiconductor chip 5 is bonded to the bonding region 34 of the multi-layered circuit structure 3 by the solder bump 54. The solder bump 54 is disposed between the bonding region 34 of the multi-layered circuit structure 3 and the bump pad 53 of the semiconductor chip 5. Then, an encapsulant 14, for example, a molding compound, is formed on the protection layer 4, and encapsulates the semiconductor chip 5 and the solder bump 54. As shown in FIG. 19, the encapsulant 14 extends along the side surface 43 of the protection layer 4 and the side surface 23 of the first insulating layer 2 to contact the second insulating layer 6.

Accordingly, the encapsulant 14 covers the side surface 23 of the first insulating layer 2 and the side surface 43 of the protection layer 4.

Figure 20:
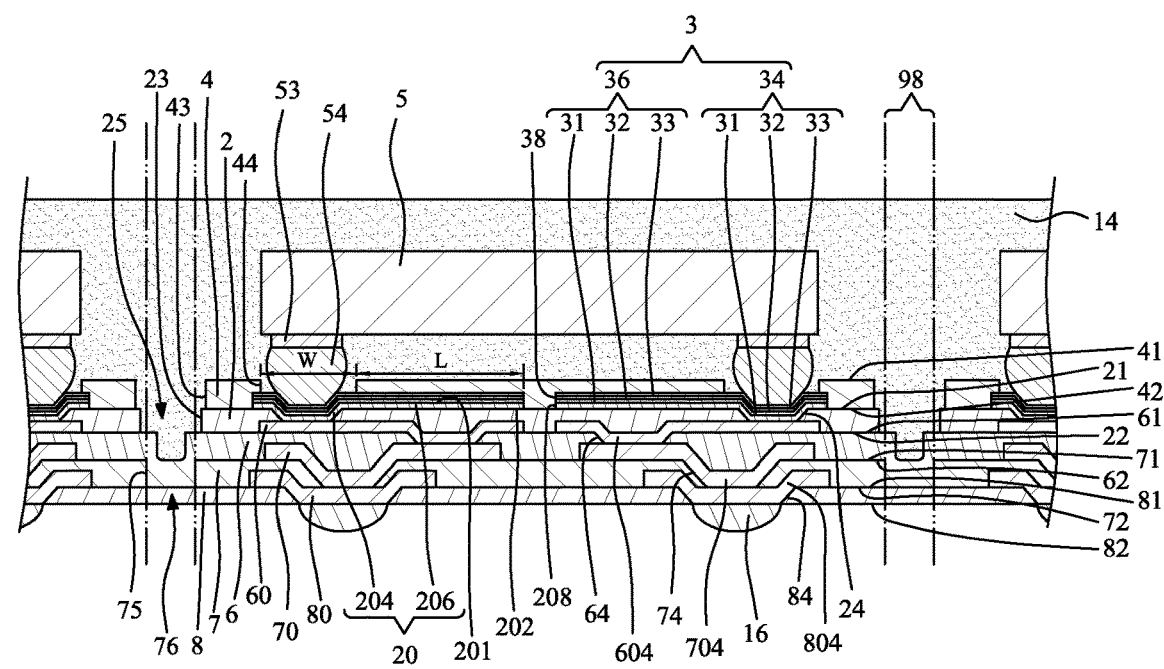
FIG. 20 illustrates one or more stages of an example of a method for manufacturing a semiconductor package structure according to some embodiments of the present disclosure.

Referring to FIG. 20, the carrier 90 is removed. Then, the seed layer 91 is removed by, for example, etching, and then a pre-solder 16 is formed on a side of the fourth conductive via 804 adjacent to the second surface 82 of the fourth insulating layer 8 for external connection. Then, a singulation process is conducted to form the semiconductor package structure 1 shown in FIG. 1. For example, the encapsulant 14, the second insulating layer 6, the third insulating layer 7 and the fourth insulating layer 8 are cut along a saw street 98, forming a side surface 143 of the encapsulant 14, a side surface 63 of the second insulating layer 6, a side surface 73 of the third insulating layer 7 and a side surface 83 of the fourth insulating layer 8. As shown in FIG. 20, a width of the saw street 98 is equal to or greater than (e.g. by a ratio of about 1.1 or more, about 1.2 or more, or about 1.3 or more) a width of the gap 76 of the third insulating layer 7. A width of the saw street 98 may be less than a width of the gap 25 (the width of the saw street 98 may be about 0.9 times the width of the gap 25 or less, about 0.8 times the width of the gap 25 or less, or about 0.7 times the width of the gap 25 or less). Hence, the side surface 63 of the second insulating layer 6, the side surface 73 of the third insulating layer 7 and the side surface 83 of the fourth insulating layer 8 are substantially coplanar. The side surface 63 of the second insulating layer 6 is substantially coplanar with the side surface 143 of the encapsulant 14.

In the manufacturing method described above, since the first conductive layer 20 and the multi-layered circuit structure 3 may be formed by using a same photomask (e.g., the photomask 94b) and/or a same photoresist (e.g., the photoresist 92b), a manufacturing cost of the semiconductor package structure 1 can be reduced. Besides, since the gaps 76 may divide the third insulating layer 7 into a plurality of units, the stress of the third insulating layer 7 is discontinuous. Thus if warpage of the third insulating layer 7 occurs, the warpage may be dispersed across the units of the third insulating layer 7. Thus, warpage of the third insulating layer 7 may be reduced (e.g. may be kept below a threshold). In addition, the second insulating layer 6 extends into and fills the gap 76 defined by the third insulating layer 7 and contacts the fourth insulating layer 8, thus, warpage corresponding to the conductive layers (e.g., the first conductive layer 20, the second conductive layer 60, the third conductive layer 70 and/or the fourth conductive layer 80) can be balanced.

Figure 21:
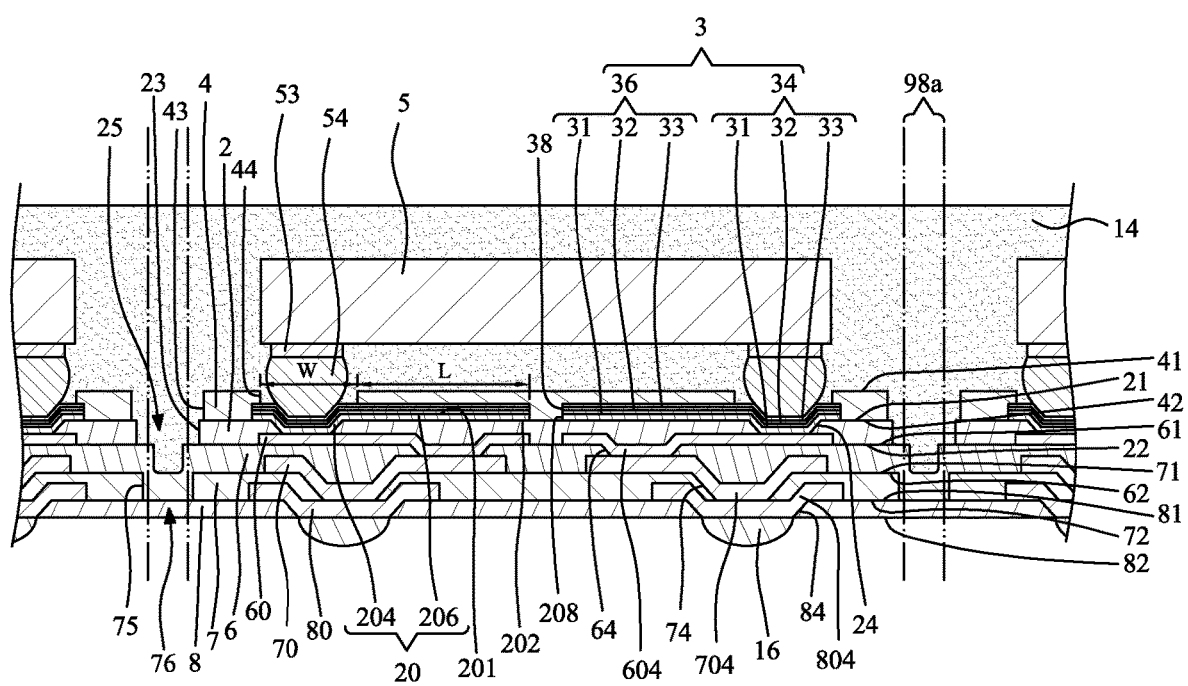
FIG. 21 illustrates one or more stages of an example of a method for manufacturing a semiconductor package structure according to some embodiments of the present disclosure.

FIG. 21 illustrates a method for manufacturing a semiconductor package structure according to some embodiments of the present disclosure. In some embodiments, the method is for manufacturing a semiconductor package structure such as the semiconductor package structure 1a shown in FIG. 2. The initial stages of the illustrated process are the same as, or similar to, the stages illustrated in FIG. 3 through FIG. 19. FIG. 21 depicts a stage subsequent to that depicted in FIG. 19.

Referring to FIG. 21, the carrier 90 is removed. Then, the seed layer 91 is removed by, for example, etching, and then a pre-solder 16 is formed on a side of the fourth conductive via 804 adjacent to the second surface 82 of the fourth insulating layer 8 for external connections. Then, a singulation process is conducted to form the semiconductor package structure 1a shown in FIG. 2. For example, the encapsulant 14, the second insulating layer 6, the third insulating layer 7 and the fourth insulating layer 8 are cut along a saw street 98a, forming a side surface 143 of the encapsulant 14, a side surface 63a of the second insulating layer 6a, a side surface 73a of the third insulating layer 7a and a side surface 83a of the fourth insulating layer 8a. As shown in FIG. 21, a width of the saw street 98a is less than a width of the gap 76 of the third insulating layer 7 (the width of the saw street 98a may be about 0.9 times the width of the gap 76 or less, about 0.8 times the width of the gap 76 or less, or about 0.7 times the width of the gap 76 or less). The side surface 63a of the second insulating layer 6a and the side surface 83a of the fourth insulating layer 8a are substantially coplanar, and the second insulating layer 6a covers a side surface 73a of the third insulating layer 7a. The side surface 63a of the second insulating layer 6a is substantially coplanar with the side surface 143 of the encapsulant 14.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising: a first insulating layer having an upper surface, a lower surface, and a side surface, the first insulating layer defining a first through hole extending through the first insulating layer; a first conductive layer having an upper surface, and comprising a conductive pad disposed in the first through hole and a trace disposed on the upper surface of the first insulating layer; a multi-layered circuit structure disposed on the upper surface of the first conductive layer, wherein the multi-layered circuit structure comprises a bonding region disposed on the conductive pad of the first conductive layer and an extending region disposed on the trace of the first conductive layer; a protection layer covering the upper surface of the first insulating layer and the extending region of the multi-layered circuit structure, and exposing the bonding region of the multi-layered circuit structure, wherein the protection layer has a side surface that is not coplanar with the side surface of the first insulating layer; a semiconductor chip electrically connected to the multi-layered circuit structure; and at least one solder bump connecting the semiconductor chip and the multi-layered circuit structure, wherein the multi-layered circuit structure comprises a barrier layer disposed on the upper surface of the first conductive layer, wherein the multi-layered circuit structure further comprises a wetting layer disposed on a the barrier layer.

2. The semiconductor package structure of claim 1, wherein a length of the extending region of the multi-layered circuit structure is greater than a maximum width of the bonding region of the multi-layered circuit structure.

3. The semiconductor package structure of claim 1, wherein a material of the first conductive layer comprises copper.

4. The semiconductor package structure of claim 1, wherein a peripheral wall of the first conductive layer aligns with a peripheral wall of the multi-layered circuit structure.

5. The semiconductor package structure of claim 4, wherein the protection layer covers the peripheral wall of the first conductive layer and the peripheral wall of the multi-layered circuit structure.

6. The semiconductor package structure of claim 1, wherein a material of the barrier layer comprises nickel.

7. The semiconductor package structure of claim 1, wherein a material of the wetting layer comprises palladium or gold.

8. The semiconductor package structure of claim 1, further comprising a second insulating layer and a second conductive layer disposed adjacent to the lower surface of the first insulating layer, and the first conductive layer is electrically connected to the second conductive layer through a first conductive via comprising the bonding region of the multi-layered circuit structure and the conductive pad of the first conductive layer.

9. The semiconductor package structure of claim 8, wherein a sum of a cross-sectional area of the multi-layered circuit structure and a cross-sectional area of the first conductive layer is in a range of about 0.5 times to about 1.5 times as large as a cross-sectional area of the second conductive layer.

10. The semiconductor package structure of claim 8, wherein the second conductive layer comprises a second conductive via extending through the second insulating layer, and a portion of the extending region of the multi-layered circuit structure is disposed directly above the second conductive via.

11. The semiconductor package structure of claim 8, wherein a side surface of the second insulating layer is not coplanar with the side surface of the first insulating layer.

12. The semiconductor package structure of claim 8, wherein a side surface of the second insulating layer is not coplanar with the side surface of the protection layer.

13. The semiconductor package structure of claim 8, wherein the second insulating layer has an upper surface and a lower surface, and defines a second through hole extending through the second insulating layer, and the second conductive layer is disposed on the upper surface of the second insulating layer and extends into the second through hole of the second insulating layer to form a second conductive via.

14. The semiconductor package structure of claim 8, further comprising a third insulating layer and a fourth insulating layer sequentially disposed on the second insulating layer, and wherein a side surface of the second insulating layer, a side surface of the third insulating layer and a side surface of the fourth insulating layer are coplanar.

15. The semiconductor package structure of claim 14, further comprising a third conductive layer and a fourth conductive layer, wherein:
   the second insulating layer has an upper surface and a lower surface, and defines a second through hole extending through the second insulating layer,
   the second conductive layer is disposed on the upper surface of the second insulating layer and extends into the second through hole of the second insulating layer to form a second conductive via,
   the third insulating layer has an upper surface and a lower surface, and defines a third through hole extending through the third insulating layer, the third conductive layer is disposed on the upper surface of the third insulating layer and extends into the third through hole of the third insulating layer to form a third conductive via, the third conductive layer is electrically connected to the second conductive layer through the second conductive via, the fourth insulating layer has an upper surface and a lower surface, and defines a fourth through hole extending through the fourth insulating layer, the fourth conductive layer is disposed on the upper surface of the fourth insulating layer and extends into the fourth through hole of the fourth insulating layer to form a fourth conductive via, and the fourth conductive layer is electrically connected to the third conductive layer through the third conductive via.

16. The semiconductor package structure of claim 8, further comprising a third insulating layer and a fourth insulating layer sequentially disposed on the second insulating layer, wherein a side surface of the second insulating layer and a side surface of the fourth insulating layer are coplanar, and the second insulating layer covers a side surface of the third insulating layer.

17. The semiconductor package structure of claim 1, wherein the at least one solder bump is disposed on the bonding region of the multi-layered circuit structure.

18. The semiconductor package structure of claim 1, further comprising an encapsulant encapsulating the semiconductor chip and the solder bump.

* * * * *